(12) United States Patent  
Draving

(10) Patent No.: US 6,262,602 B1
(45) Date of Patent: Jul. 17, 2001

(54) INCIDENT-EDGE DETECTING PROBE

(75) Inventor: Steven D. Draving, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/272,034

(22) Filed: Mar. 18, 1999

(51) Int. Cl.[7] .................................................. H03K 5/153
(52) U.S. Cl. ............................................. 327/74; 375/287
(58) Field of Search .............................. 327/74, 50, 77, 327/78, 80, 81, 76; 375/287

(56) References Cited

U.S. PATENT DOCUMENTS

| | | | |
|---|---|---|---|
| 4,524,291 | * 6/1985 | Lehning | 327/76 |
| 4,968,902 | * 11/1990 | Jackson | 327/74 |
| 5,105,444 | * 4/1992 | Gard | 375/49 |
| 5,210,527 | * 5/1993 | Smith et al. | 340/659 |
| 5,336,944 | * 8/1994 | Fischer | 327/74 |
| 5,336,947 | * 8/1994 | Lehning | 327/18 |
| 5,465,059 | * 11/1995 | Pan et al. | 327/12 |
| 5,544,175 | * 8/1996 | Posse | 371/25.1 |
| 5,933,459 | * 8/1999 | Saunders et al. | 375/317 |

* cited by examiner

Primary Examiner—Tuan T. Lam
Assistant Examiner—Hai L. Nguyen
(74) Attorney, Agent, or Firm—Alexander J. Neudeck

(57) ABSTRACT

A comparator detects rising transitions of an input waveform and another comparator detects falling transitions. Each comparator detects their respective transition with a different threshold voltage. The outputs of these comparators are multiplexed into the clock input of a flip-flop. The flip-flop's inverted output is connected through a time delay to the input of the flip-flop to form a toggling configuration. The output of the time delay is also connected to the select input of a multiplexer that controls the multiplexer to multiplex the outputs of the two comparators into the clock input of the flip-flop. The threshold voltages chosen for the two comparators are chosen to be in the center of the incident edges of the distorted signal of a source-terminated transmission line. The time delay is chosen to be longer than the difference between the arrival of the incident wave and the arrival of the first reflected wave.

8 Claims, 3 Drawing Sheets

INCIDENT-EDGE DETECTING PROBE

FIELD OF THE INVENTION

This invention relates generally to logic analyzer probes and more particularly to a circuit and method for detecting incident edges on a source terminated transmission line.

BACKGROUND OF THE INVENTION

Several techniques exist for interfacing integrated circuits and other digital electronic devices with one another in high-performance, transmission line environments. Some of these use load termination to eliminate unwanted signal reflections that occur because of impedance mismatches along the transmission line. Standard interfaces such as GTL (Gunning Transceiver Logic) and PECL commonly use this kind of transmission. Another technique that offers some advantages over this accepted method of termination is the source-terminated driver method. A source-terminated line does not use load termination. Instead, a source-terminated line relies upon reflections off an unterminated end-of-line to reach a valid voltage level and then terminates the reflected waves back at the source.

Source-terminated lines and busses may be difficult to probe because the electrical signals can appear distorted if viewed or probed at a location other than the receiving end of the bus. This distortion is caused by the separation between the incident and reflected waves of logic transition traveling on the line. This distortion can also cause glitches and timing uncertainty in the detected version of the probed signal's logic transitions.

Accordingly, there is a need in the art for a probe circuit that can reliably detect the incident wave of a logic transition on a source-terminated bus. By detecting the incident wave and ignoring any reflections, the timing of the logic transition can be measured with greater certainty than detecting both the incident wave and possibly some reflected waves. Furthermore, detecting just the incident wave prevents reflected waves from possibly being detected as glitches on the line.

SUMMARY OF THE INVENTION

A preferred embodiment of the invention provides a means of detecting the state of a source terminated line when not probing the line at the receiving end. The invention may be tuned to different logic levels, propagation delays, and is capable of separating minor reflections from true line glitches.

The present invention includes two comparators. One comparator detects rising transitions of the input waveform and one comparator detects falling transitions. Each comparator detects their respective transition with a different threshold voltage. The outputs of these comparators are multiplexed into the clock input of a flip-flop. The flip-flop's inverted output is connected through a time delay to the input of the flip-flop to form a toggling configuration. The output of the time delay is also connected to the select input of a multiplexer to control the multiplexer to multiplex the outputs of the two comparators into the clock input of the flip-flop. In a preferred embodiment the threshold voltages chosen for the two comparators are chosen to be in the center of the incident edges of the distorted signal. The time delay is chosen to be longer than the difference between the arrival of the incident wave and the arrival of the first reflected wave.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
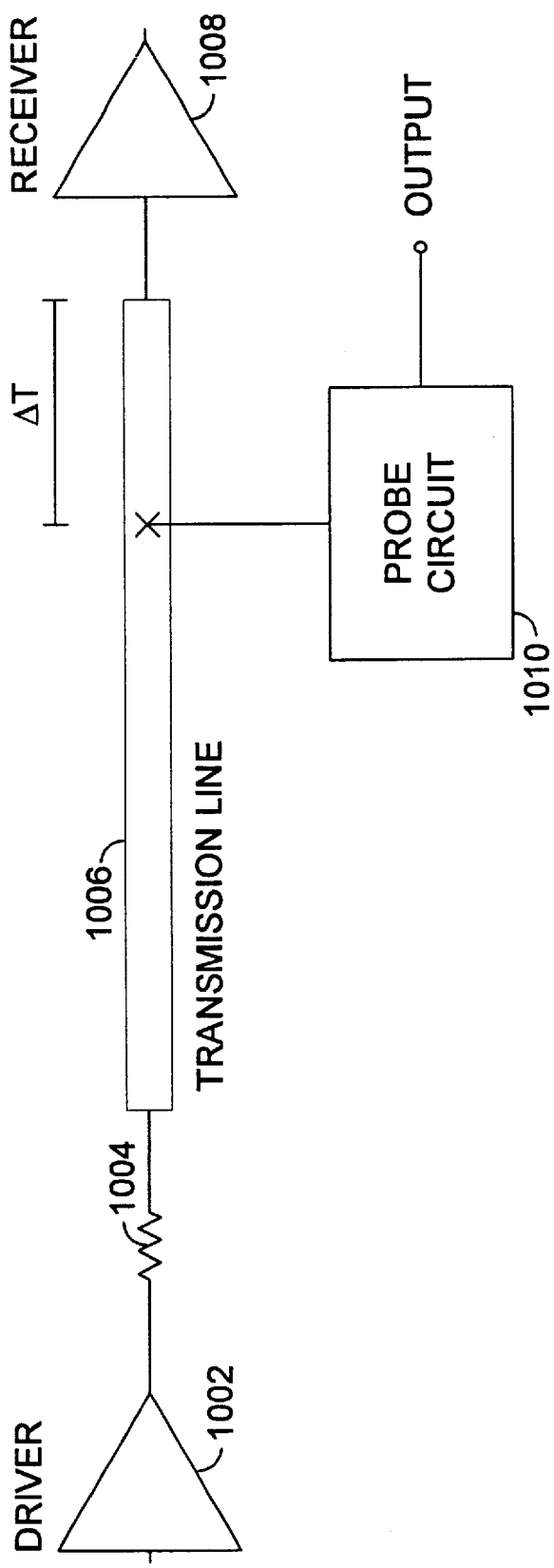
FIG. 1 is a schematic diagram of an exemplary source-terminated line being probed.

FIG. 1 is a schematic diagram of an exemplary source-terminated line being probed. Driver 1002 drives transmission line 1006 with a source impedance 1004. Source impedance 1004 may be inherent in driver 1002 or it may be a separate component. Receiver 1008 receives the signal transmission line 1006 that is driven by driver 1002. The input of probe circuit 1010 is connected to transmission line 1010 at a propagation delay of $\Delta T$ from the receiving end of transmission line 1010.

Figure 2:
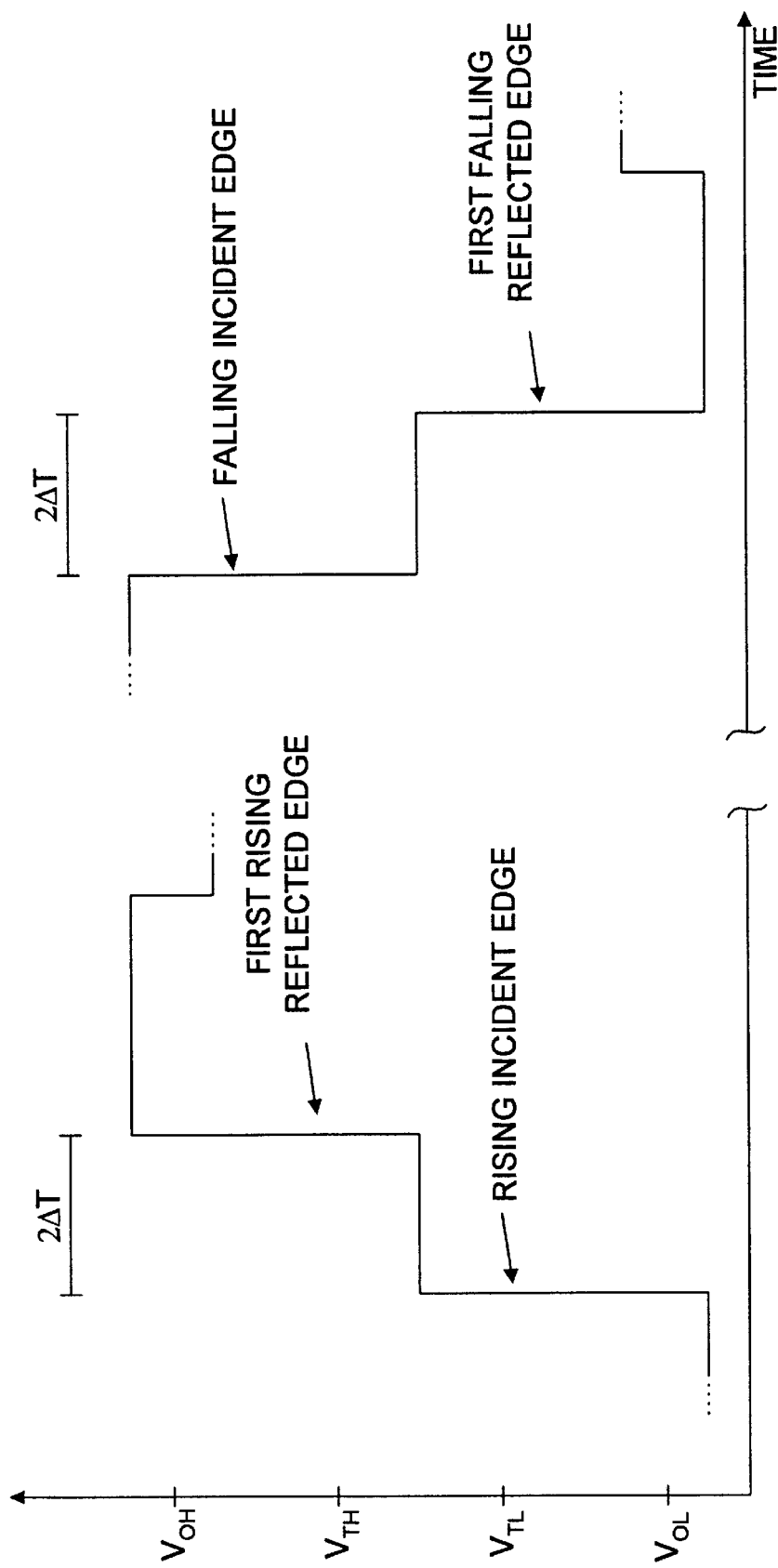
FIG. 2 is an exemplary plot of voltage versus time on a source-terminated line as seen at a probe point.

FIG. 2 is an exemplary plot of voltage versus time on a source-terminated line as seen at a probe point. As can be seen, the voltage at the probe point starts at or around $V_{OL}$. Then, some time after driver 1002 begins driving a low-to-high transition, the rising incident edge arrives at the probe point. Note that after the incident edge has passed the probe point, the voltage on the line as seen by the probe may not be a valid logic level. The voltage as seen by the probe can be too high to be a valid logic low, and too low to be a valid logic high. Later, after the incident wave has propagated to, and reflected off, the end of the transmission line 1006 and the reflected wave has propagated back to the probe point (a delay of $2\Delta T$ total), the voltage at the probe point rises above $V_{OH}$. Also, further reflections can occur both off of the driving end and receiving end of transmission line 1006. Some of these reflections can cause the voltage as seen at the probe point to fall below $V_{OH}$.

For a falling edge, the voltage at the probe point starts at or around $V_{OH}$. Then, some time after driver 1002 begins driving a high-to-low transition, the falling incident edge arrives at the probe point. Note that after the incident edge has passed the probe point, the voltage on the line as seen by the probe may not be a valid logic level. The voltage as seen by the probe can be too low to be a valid logic high, and too high to be a valid logic low. Later, after the incident wave has propagated to, and reflected off, the end of the transmission line 1006 and the reflected wave has propagated back to the probe point (a delay of $2\Delta T$ total), the voltage at the probe point falls below $V_{OL}$. Also, further reflections can occur both off of the driving end and receiving end of transmission line 1006. Some of these reflections can cause the voltage as seen at the probe point to rise above $V_{OL}$.

Because the voltage at the probe point is at an intermediate value for at least $2\Delta T$ during each transition, and because reflections can cause the voltage at the probe point to rise above $V_{OL}$ or fall below $V_{OH}$, a probe circuit that relies solely on valid logic levels will produce results that can have timing uncertainty and may produce glitches. The present invention solves this problem.

Figure 3:
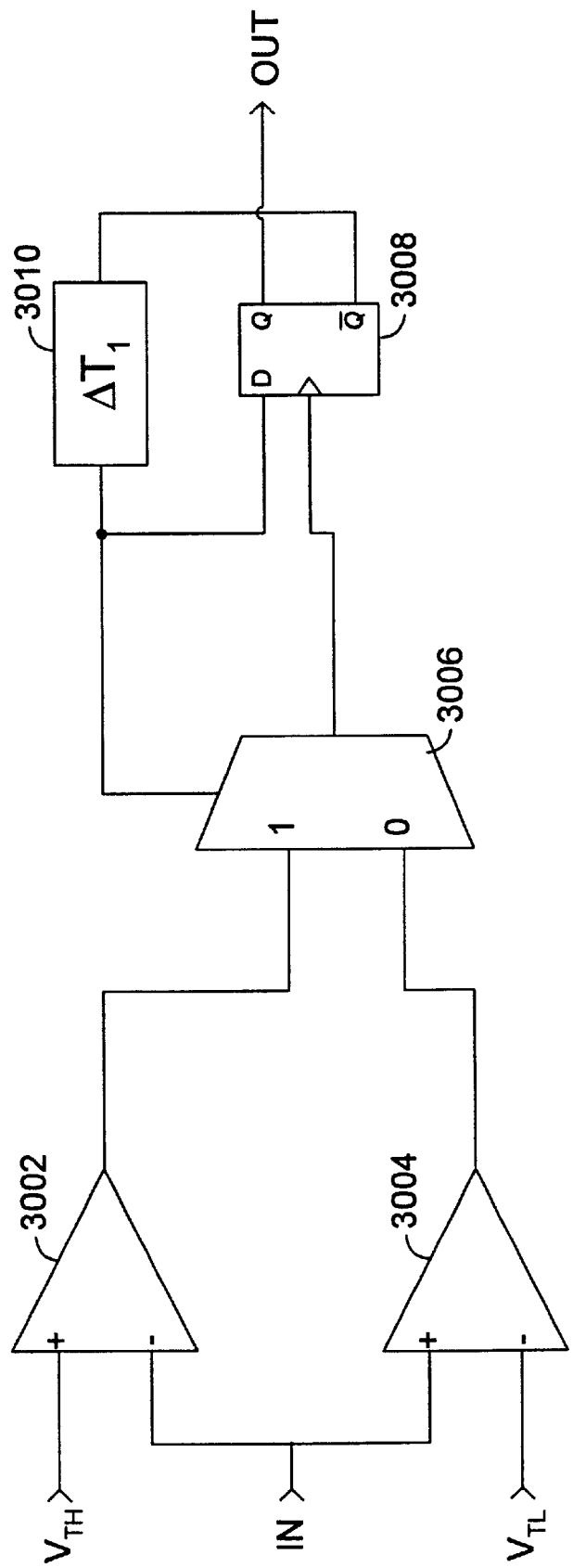
FIG. 3 is schematic diagram of the incident-edge detection circuit.

FIG. 3 is a schematic diagram of an incident-edge detection circuit. In FIG. 3, the input (IN) of the incident-edge detection circuit is connected to the inverting input of comparator 3002 and the non-inverting input of comparator 3004. The non-inverting input of comparator 3002 is connected to the high-to-low threshold voltage, $V_{TH}$. The inverting input of comparator 3004 is connected to the low-to-high threshold voltage, $V_{TL}$. The output of comparator 3002 is connected to one data input of a two-to-one multiplexer 3006. The output of comparator 3004 is connected to the other data input of multiplexer 3006. The output of multiplexer 3006 is connected to the clock input of flip-flop 3008. The output of flip-flop 3008 is the output of the incident-edge detector, OUT. An inverted output of flip-flop 3008 (or the output of 3008 inverted) is connected to the input of a time delay element 3010. The output of time delay element 3010 follows its input except that it is delayed by predetermined period of time, $\Delta T_1$. The output of time delay element 3010 is connected to the data input of flip-flop 3008. Since the output of time delay element 3010 is an inverted and time delayed version of the output of flip-flop 3008, this arrangement will toggle when clocked. Other arrangements that toggle when clocked, such as a "T" type flip-flop or an appropriately wired "JK" type flip-flop could also be used. The output of time delay element 3010 is also connected to the control input of multiplexer 3006. When high, the control input causes multiplexer 3006 to relay the output of comparator 3002 to the clock input of flip-flop 3008. When low, the control input causes multiplexer 3006 to relay the output of comparator 3004 to the clock input of flip-flop 3008.

When the incident-edge detector is initialized, its output, OUT, can be chosen to have the same logic state as the logic state on transmission line 1006. Similarly, if an inverted output is desired, the incident-edge detector can be initialized such that its output is the opposite as the logic state on transmission line 1006. For the purposes of this discussion, it will be assumed that the edge detector was initialized so that its output will invert the logic state on transmission line 1006. Accordingly, when transmission line 1006 is at or near $V_{OL}$, as is shown at the start of FIG. 2, OUT is at a logical high, and the control input to multiplexer 3006 is at a logical low so that the output of comparator 3004 is being relayed to the clock input of flip-flop 3008.

In FIG. 2, the voltage at the probe point starts at or around $V_{OL}$. Then, some time after driver 1002 begins driving a low-to-high transition, the rising incident-edge arrives at the probe point. After the incident-edge has passed the probe point, the voltage on the line as seen by the probe is at some intermediate level that may not be a valid logic level. However, the threshold voltage $V_{TL}$ is chosen to be lower than this intermediate level. Therefore, the output of comparator 3004 switches from a low to a high level. This transition is relayed to the clock input of flip-flop 3008 causing OUT to toggle from a logical high to a logical low. At roughly the same time, the inverting output of flip-flop 3008 makes a low-to-high transition. This transition is then delayed by $\Delta T_1$, by delay element 3010. In a preferred embodiment the delay $\Delta T_1$, is chosen to be greater than $2\Delta T$. In this case, by the time the output of delay element 3010 makes its low-to-high transition, the incident-edge has propagated to the end of transmission line 1006, been reflected, and the reflected wave has propagated past the probe point so that the voltage at the probe point is greater than $V_{TH}$. Accordingly, the output of comparator 3002 will be low when the control input to multiplexer 3006 goes high. When the control input to multiplexer 3006 goes high, multiplexer 3006 begins relaying the output of comparator 3002 to the clock input of flip-flop 3008. Any further reflections are now ignored by the incident-edge detector as long as they don't go below $V_{TH}$.

On a falling incident edge, the voltage at the probe point starts at or around $V_{OH}$. Then, some time after driver 1002 begins driving a high-to-low transition, the falling incident-edge arrives at the probe point. After the incident-edge has passed the probe point, the voltage on the line as seen by the probe is at some intermediate level that may not be a valid logic level. However, the threshold voltage $V_{TH}$ is chosen to be higher than this intermediate level. Therefore, the output of comparator 3002 switches from a low to a high level. This transition is relayed to the clock input of flip-flop 3008 causing OUT to toggle from a logical low to a logical high. At roughly the same time, the inverting output of flip-flop 3008 makes a high-to-low transition. This transition is then delayed by $\Delta T_1$ by delay element 3010. In a preferred embodiment the delay $\Delta T_1$ is chosen to be greater than $2\Delta T$. In this case, by the time the output of delay element 3010 makes its high-to-low transition, the incident-edge has propagated to the end of transmission line 1006, been reflected, and the reflected wave has propagated past the probe point so that the voltage at the probe point is less than $V_{TL}$. Accordingly, the output of comparator 3004 will be low when the control input to multiplexer 3006 goes low. When the control input to multiplexer 3006 goes low, multiplexer 3006 begins relaying the output of comparator 3004 to the clock input of flip-flop 3008. Any further reflections are now ignored by the incident-edge detector as long as they don't go above $V_{TL}$.

From the foregoing it will be appreciated that the probe circuit of the invention provides a novel and advantageous way of detecting the logic state being driven on a source-terminated transmission line. In cases where the driver's source impedance is smaller than the transmission line's characteristic impedance or for signals with excessive ring-back, detecting incident edges has better noise margins that the reflected edges. Also, many systems are intolerant to glitches on edge-sensitive signals. These glitches can be filtered out by this circuit. Finally, the threshold levels ($V_{TH}$ and $V_{TL}$) of two independent compartors can typically be controlled more accurately than those achieved using a single comparator having hysteresis.

Although several specific embodiments of the inventions have been described and illustrated, the invention is not to be limited to the specific forms or arrangements of parts so described and illustrated. The invention is limited only by the claims.

What is claimed is:

1. An apparatus for determining a logic state of a source-terminated transmission line, comprising:

a connection to said transmission line, said connection not being at an end of said transmission line;

a first comparator, said first comparitor producing a first output in response to a first comparison of a voltage at said connection to a first threshold voltage;

a second comparator, said second comparitor producing a second output in response to a second comparison of said voltage at said connection to a second threshold voltage;

a selector, said selector selecting one of said first output and said second output wherein said selector has a control input that determines which of said first out put and said second output is selected, wherein said control in put is controlled by a delayed version of a state output, wherein said delayed version of said state output is delayed by a time $\Delta t$ and said time $\Delta t$ is greater than twice a propagation delay in a direction of pro pagation of all incident edges from said connection to said end of said transmission line that said incident edges reach; and, a toggling circuit, said toggling circuit changing said state output in response to said selected one of said first output and said second output.

2. The apparatus of claim 1 wherein said first threshold voltage is between a first valid voltage level and a first intermediate voltage level and wherein said first intermediate voltage level is approximately a first incident wave voltage level.

3. The apparatus of claim 2 wherein said second threshold voltage is between a second valid voltage level and a second intermediate voltage level and wherein said second intermediate voltage level is approximately a second incident wave voltage level.

4. An apparatus for determining a logic state of a source-terminated transmission line, comprising:

a first comparitor, said first comparator producing a first output in response to a first comparison of a voltage at a connection to said transmission line and a first threshold voltage, wherein said first threshold voltage is greater than a first valid voltage level and less than a first intermediate voltage level;

a second comparitor, said second comparator producing a second output in response to a second comparison of said voltage at said connection to said transmission line and a second threshold voltage, wherein said second threshold voltage is less than a second valid voltage level and greater than a second intermediate voltage level;

a selector, said selector selecting one of said first output and said second output wherein said selector is controlled by a delayed version of a state, wherein said delayed version is delayed by an amount of time greater than twice a propagation delay from said connection to said transmission line to an end of said transmission line and wherein said end of said transmission line is not being driven; and, a toggling circuit, said toggling circuit changing said state in response to said selected one of said first output and said second output.

5. A method for determining a logic state of a source-terminated transmission line at a connection point wherein said connection point is not at an end of said transmission line, comprising:

producing a first output in response to a first comparison of a voltage at said connection point to a first threshold voltage;

producing a second output in response to a second comparison of said voltage at said connection point to a second threshold voltage;

selecting one of said first output and said second output wherein said selecting is controlled by a delayed version of a state output, wherein said delayed version of said state out put is delayed by a time $\Delta t$ and said time $\Delta t$ is greater than twice a propagation delay in a direction of pro pagation of all incident edges from said connection point to said end of said transmission line that said incident edges reach; and, changing said state output in response to said selected one of said first output and said second output.

6. The method of claim 5 wherein said first threshold voltage is between a first valid voltage level and a first intermediate voltage level and wherein said first intermediate voltage level is approximately a first incident wave voltage level.

7. The method of claim 6 wherein said second threshold voltage is between a second valid voltage level and a second intermediate voltage level and wherein said second intermediate voltage level is approximately a second incident wave voltage level.

8. A method for determining a logic state of a source-terminated transmission line, comprising:

producing a first output in response to a first comparison of a voltage at a connection to said transmission line and a first threshold voltage, wherein said first threshold voltage is greater than a first valid voltage level and less than a first intermediate voltage level;

producing a second output in response to a second comparison of said voltage at said connection to said transmission line and a second threshold voltage, wherein said second threshold voltage is less than a second valid voltage level and greater than a second intermediate voltage level;

selecting one of said first output and said second output wherein said selecting is controlled by a delayed version of a state, wherein said delayed version is delayed by an amount of time greater than twice a propagation delay from said connection to said transmission line to an end of said transmission line and wherein said end of said transmission line is not being driven; and, changing said state in response to said selected one of said first out put and said second output.

* * * * *